(12) United States Patent
Agrawal et al.

(10) Patent No.: US 12,354,639 B2
(45) Date of Patent: Jul. 8, 2025

(54) METHOD AND SYSTEM FOR REFRESHING MEMORY OF A PORTABLE COMPUTING DEVICE

(71) Applicant: QUALCOMM INCORPORATED, San Diego, CA (US)

(72) Inventors: Pranav Agrawal, Hyderabad (IN); Akash Suthar, Sirohi (IN); Aman Chhetry, Hazaribagh (IN); Kunal Desai, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 295 days.

(21) Appl. No.: 18/249,925

(22) PCT Filed: Oct. 20, 2021

(86) PCT No.: PCT/US2021/055863
§ 371 (c)(1),
(2) Date: Apr. 20, 2023

(87) PCT Pub. No.: WO2022/108700
PCT Pub. Date: May 27, 2022

(65) Prior Publication Data
US 2023/0386551 A1   Nov. 30, 2023

(30) Foreign Application Priority Data
Nov. 23, 2020   (IN) .............................. 202041050957

(51) Int. Cl.
*G11C 7/00* (2006.01)
*G11C 11/406* (2006.01)

(52) U.S. Cl.
CPC .. *G11C 11/40618* (2013.01); *G11C 11/40615* (2013.01)

(58) Field of Classification Search
CPC ........ G11C 11/40618; G11C 11/40615; G11C 2211/406; G11C 11/406; G11C 2211/4063
See application file for complete search history.

(56) References Cited

U.S. PATENT DOCUMENTS

2002/0021595 A1*   2/2002   Terada ..................... G11C 8/12
                                                365/200
2011/0225465 A1*   9/2011   Blackmon ............ G06F 11/073
                                                711/E12.001

(Continued)

FOREIGN PATENT DOCUMENTS

EP            3364298 A2      8/2018

OTHER PUBLICATIONS

Corresponding PCT App. Ser. No. PCT/US2021/055863, Filed Oct. 20, 2021, International Search Report & Written Opinion Transmitted in Jan. 17, 2022, 10Pages.

*Primary Examiner* — Hien N Nguyen
(74) *Attorney, Agent, or Firm* — Smith Tempel Blaha LLC/Qualcomm

(57) ABSTRACT

A kernel of an HLOS may originate one or more memory refresh requests. Each memory refresh request may have a first memory address range and a size value. A resource power manager may be coupled to the kernel and coupled to memory. The memory may have a plurality of memory ranks. The resource power manger may receive a memory refresh request from the kernel. The resource power manager may then determine if the plurality of memory ranks is either symmetrical or asymmetrical. If the memory ranks are symmetrical, then the resource power manager distributes the memory refresh request evenly and in a parallel manner across the symmetrical memory ranks. If the memory ranks are asymmetrical, then the resource power manager will then determine if the memory refresh request should be one of: a (Continued)

linear only memory refresh; an interleave with linear memory refresh; or an interleave only memory refresh.

30 Claims, 7 Drawing Sheets

(56) References Cited

U.S. PATENT DOCUMENTS

| | | | |
|---|---|---|---|
| 2012/0151131 A1* | 6/2012 | Kilmer | G11C 11/406 711/E12.001 |
| 2017/0300415 A1* | 10/2017 | Bonen | G06F 13/1678 |
| 2023/0098902 A1* | 3/2023 | Desai | G11C 29/38 714/6.11 |

* cited by examiner

Example For Asymmetric case:
Total size of DRAM = 6GB (rank0 2GB + rank1 4GB)
rank0_min_pasr_size = (rank0)/8 = 256MB
rank1_min_pasr_size = (rank1)/8 = 512MB

400

| THREE ASYMMETRIC CASES | PASR ADD | PASR SIZE | PASR Rank0 Address | PASR Rank1 Address | Rank0 Segments in PASR | Rank1 Segments in PASR | Rank0 PASR SIZE | Rank1 PASR SIZE |
|---|---|---|---|---|---|---|---|---|
| LINEAR ONLY (steps 330, 355) | 5GB | 1GB | NONE | 3GB | None | 6,7 | NONE | 1GB |
| INTERLEAVE ONLY (steps 345, 350) | 2GB | 2GB | 1GB | 1GB | 4,5,6,7 | 2,3 | 1GB | 1GB |
| INTERLEAVE + LINEAR (steps 335, 340) | 3GB | 3GB | 1.5GB | 1.5GB | 6,7 | 3,4,5,6,7 | 512MB | 2.5GB |

405 → LINEAR ONLY
410 → INTERLEAVE ONLY
415 → INTERLEAVE + LINEAR

FIG. 4

Example For Symmetric case
Total size of DRAM = 8GB (rank0 4GB + rank1 4GB)
rank0_min_pasr_size = (rank0)/8 = 512MB
rank1_min_pasr_size = (rank1)/8 = 512MB

500

| Case | PASR ADD | PASR SIZE | PASR Rank0 Address | PASR Rank1 Address | Rank0 Segments in PASR | Rank1 Segments in PASR | Rank0 PASR SIZE | Rank1 PASR SIZE |
|---|---|---|---|---|---|---|---|---|
| Rank Interleave for symmetric | 6GB | 2GB | 3GB | 3GB | 6,7 | 6,7 | 1GB | 1GB |

METHOD AND SYSTEM FOR REFRESHING MEMORY OF A PORTABLE COMPUTING DEVICE

DESCRIPTION OF THE RELATED ART

Portable computing devices ("PCD"s) are becoming necessities for people on personal and professional levels. These devices may include mobile phones, tablet computers, palmtop computers, portable digital assistants ("PDA"s), portable game consoles, and other portable electronic devices. PCDs commonly contain integrated circuits or systems-on-a-chip ("SoC"s) that include numerous components or subsystems designed to work together to deliver functionality to a user.

For example, an SoC may contain various memory storage devices such as Dynamic random-access memory (DRAM). A series of DRAM chips may exist on a SOC and this series of DRAM chips may be referred to as a memory rank, as understood by one of ordinary skill in the art. A PCD may have a plurality of memory ranks.

Usually, the plurality of memory ranks within the DRAM needs to be refreshed during its operation. Such refreshing of DRAM is often referred to as Partial Array Self-refreshes (PASRs).

PASR is an optimal feature to save the maximum power by utilizing the only required DRAM segment from double-data rate (DDR) DRAM. Each DRAM memory cell usually includes one metal-oxide-semiconductor field-effect transistor (MOSFET) and one capacitor to store one bit (binary data) using an external electronic charge. Because electrical current will leak from the capacitor over time, capacitors must be refreshed periodically to maintain data integrity.

The self-refresh operation (i.e. PASR), usually deactivates the clock to DRAM to reduce power consumption of the PCD, and a PASR may be automatically executed at certain intervals within the DRAM. A self-refresh mode may be effective to maintain data integrity when DRAM has not been accessed (read/write) for a long period of time. Power conservation is of a concern for most PCDs, since most PCDs are battery-powered.

One problem with PASR is that conventional DRAMs are re-freshed in a linear manner, meaning that a first memory rank is refreshed first, and then after the first memory rank is refreshed, then a second memory rank is refreshed. PASR requests are problematic since they consume power for the PCD and multiple requests may consume significant amounts of power if they are not performed efficiently.

Another problem that exists in the art is that, frequently, memory ranks of DRAM may be asymmetrical with respect to their size. In other words, a first memory rank of DRAM may have a first size. Meanwhile, a second memory rank of DRAM may have a second size which is larger than a first size. So distributing PASR requests across two or more unevenly sized memory ranks in an efficient manner may be problematic.

Accordingly, what is needed in the art is a method and system that overcomes the problems associated with the non-interleaving of PASR requests among asymmetric memory ranks described above, which includes lack of power conservation and/or inefficient refreshing of memory ranks. What is needed is a method and system which may provide for an efficient interleaving of PASR requests from a kernel of an operating system, where the PASR requests are interleaved among two or more asymmetric memory ranks that form the entire memory of a portable computing device.

SUMMARY OF THE DISCLOSURE

Systems, methods, computer-readable media, and other examples for refreshing memory, such as DRAM in PCDs, are disclosed herein. A method and system for refreshing memory in a computing device having asymmetrical memory ranks of different sizes may include receiving a memory refresh request from a kernel. The memory refresh request may include a start memory address and a size value. Based on the size value and the start memory address, an end memory address may be calculated.

Next, it is determined whether the start memory address value and end memory address value of the refresh request both exceed a threshold. This threshold may be based on a minimum size of two memory ranks that form an asymmetrical memory configuration.

Then, a linear only refresh of one memory rank may be initiated based on the memory refresh request if the start memory address value and end memory address value of the refresh request both exceed the threshold.

Meanwhile, the method and system may include determining if the start memory address is less than or equal to the threshold and if the end memory address is greater than the threshold. A linear with interleave memory refresh of the asymmetrical memory ranks may be initiated if the start memory address is less than or equal to the threshold and if the end memory address is greater than the threshold. And an interleave only memory refresh of the asymmetrical memory ranks may be initiated if the first memory address and end memory address are both less than the threshold. The method and system may further include determining a size of a memory refresh for a small memory rank and a size of a memory refresh of a larger memory rank based on the start memory address.

A method and system for refreshing memory in a computing device may include an operating system having a kernel for originating memory offline or online refresh requests. Each memory refresh offline or online request may have a start memory address and a size value. A resource power manager may be coupled to the kernel and coupled to memory. The memory may have a plurality of memory ranks.

The resource power manger may receive a memory refresh request from the kernel. The resource power manager may then determine if the plurality of memory ranks is either symmetrical or asymmetrical.

If the memory ranks are symmetrical, then the resource power manager distributes the memory refresh request evenly and in a parallel manner across the symmetrical memory ranks. If the memory ranks are asymmetrical, then the resource power manager may determine an end memory address based on the start memory address and the size value. The resource power manager will then determine if the memory refresh request should be one of: a linear only memory refresh; an interleave with linear memory refresh; or an interleave only memory refresh.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

FIG. 4 is a table illustrating the three types of interleave scenarios for an asymmetric DRAM memory configuration that are supported by the exemplary method;

FIG. 5 is a table illustrating a PASR request handled by a symmetric DRAM memory configuration;

DETAILED DESCRIPTION

The word "exemplary" is used herein to mean "serving as an example, instance, or illustration." The word "illustrative" may be used herein synonymously with "exemplary." Any aspect described herein as "exemplary" is not necessarily to be construed as preferred or advantageous over other aspects. The term "coupled" may be used herein to mean connected via zero or more intervening elements, in contrast with the term "directly connected," which may be used herein to mean connected via no intervening elements.

Figure 1:
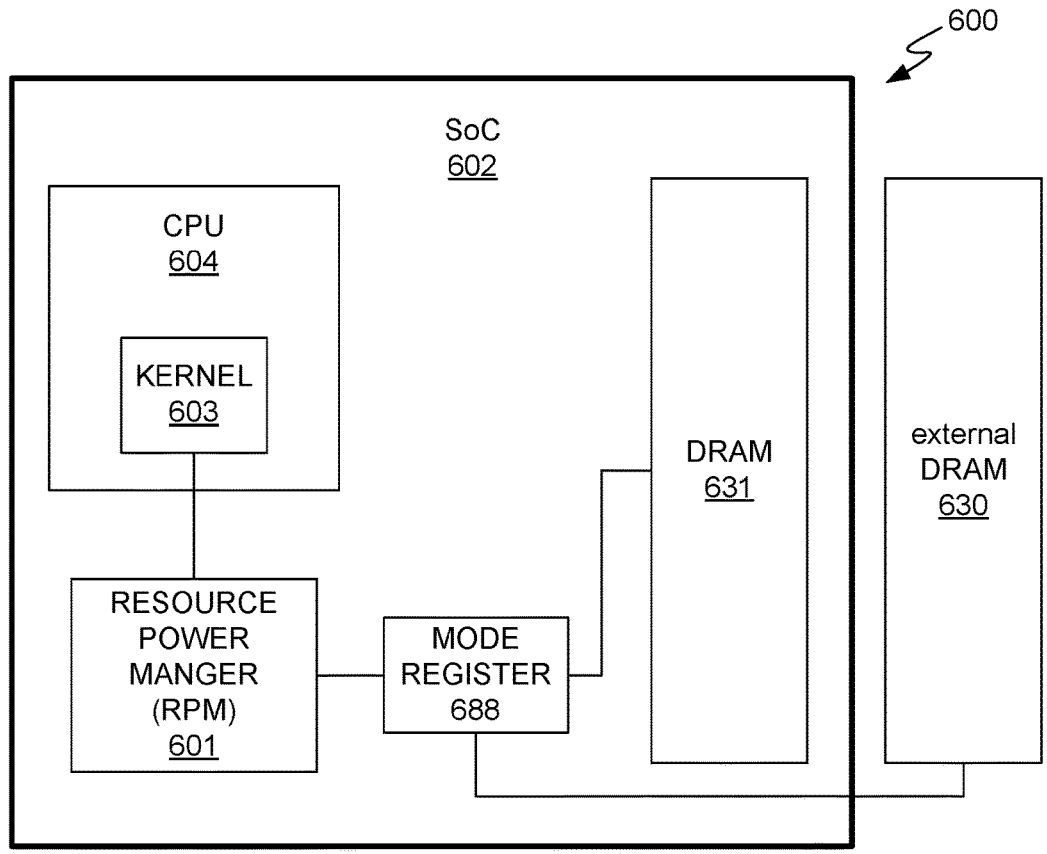
FIG. 1 illustrates portions of a portable computing device (PCD) which may include a system-on-chip that has a central processing unit (CPU), a resource power manager (RPM), a mode register, and dynamic random-access memory (DRAM)

Referring now to FIG. 1, in an illustrative or exemplary embodiment, a portable computing device (PCD) 600 (see also FIG. 6) may include a system-on-chip (602) which has a central processing unit (CPU) 604, a resource power manager (RPM) 601, a mode register 688, and internal DRAM 631 located on the chip 602. The PCD 600 may further include external DRAM 630 that is off-chip, i.e. one that is located off-of/external-to SoC 602.

Each DRAM 631, 630 may have one or more memory ranks (see FIGS. 2A-2B) which are formed from multiple memory chips 202. Each DRAM 631, 630 may be any one of Double Data Rate (DDR) memory, Low-Power Double Data Rate (LPDDR) memory, Double Data Rate 2 Synchronous Dynamic Random-Access Memory (DDR2 SDRAM), or Double Data Rate 3 Synchronous Dynamic Random-Access Memory (DDR3 SDRAM), just to name a few. Other memory types formed from ranks are possible and are included within the scope of this disclosure.

As will be explained in more detail below, two or more memory ranks for each DRAM 631, 630 may be asymmetrical relative to each other. In other words, each memory rank, in an asymmetrical configuration, may have uneven sizes relative to each other. For example, a first rank, rank0 may have a size of 2.0 Gigabytes (GB), while a second rank, rank1, may have a size of 4.0 Gigabytes (GB). (See FIGS. 2B, 3A-3C described below).

According to other exemplary embodiments, the memory ranks may be symmetrical in size. In other words, in a symmetrical configuration, memory ranks may have equal sizes, such as each rank having 4.0 GB of memory. Other sizes and combinations of memory ranks are possible and are included within the scope of this disclosure. That is, other sizes beyond and below 2.0 GB and 4.0 GB symmetrical memory ranks are possible and are included as understood by one of ordinary skill in the art.

The CPU 604 may execute a kernel 603. The kernel 603 is a computer program at the core of a high level operating system (HLOS) for the PCD 600. The kernel 603 is usually a portion of the HLOS that is always resident in memory and it usually facilitates interactions between hardware and/or software components of the PCD 600.

The kernel 603 may originate one or more Partial Array self-refresh (PASR) requests. As noted previously, PASR is an optimal feature to save the maximum power by utilizing the only required DRAM segment from double-data rate DRAM. The kernel 603 usually sends PASR requests to the resource power manager (RPM) 601. The RPM 601 usually monitors the power consumption of the hardware supporting the software functions of the PCD 600.

The RPM 601, according to the inventive system, may comprise logic and/or it may execute computer code that corresponds to the logic flow charts illustrated in FIGS. 3E-3H. Specifically, the RPM 601 may execute software corresponding to FIGS. 3E-3H which may interleave PASR requests from the kernel 603 among two or more memory ranks that may form internal DRAM 631 or external DRAM 630 or both. That is, the RPM 601 may apply logic in order to determine how to distribute PASR requests among two or more memory ranks within DRAMs 631, 630 which may reduce power consumption and increase DRAM memory refresh efficiency.

In a case of the asymmetric (or unbalanced) memory rank configuration, data cannot be distributed equally across memory ranks. So data is stored in an interleave manner until one of the smaller ranks is filled while remaining data is filled in the larger rank in a linear fashion.

While logic of the RPM 601 as illustrated in FIGS. 3E-3H have been described in terms of software, portions of the system may be implemented in hardware, or software, or any combination thereof. If implemented in hardware, the devices supporting the logic of FIGS. 3E-3H may include any, or a combination of, the following technologies, which are all well known in the art: discrete electronic components, an integrated circuit, an application-specific integrated circuit having appropriately configured semiconductor devices and resistive elements, etc. Any of these hardware devices, whether acting or alone, with other devices, or other components such as a memory may also form or comprise components or means for performing various operations or steps of the disclosed and illustrated method steps.

The RPM 601 may receive PASR requests from the kernel 603 and determine how to divide the PASR requests among two or more memory ranks of DRAM 631, 630. In some instances, depending upon the size of the PASR request, the RPM 601 may determine that interleaving of the PASR request may not be as efficient as completing the PASR request in a linear manner. So the RPM 601, in some instances, may determine that a linear only completion of a PASR request is more efficient as will be explained in more detail below. Further, the RPM 601 may also determine that a first portion of a PASR request should be completed in a linear manner while a second portion of the PASR request should be completed in an interleaved fashion, such that the PASR request is completed using both a linear and an interleave scheme.

The RPM 601, once it determines how it will distribute a PASR request from the kernel 603, the RPM 601 will send the appropriate commands to the mode register (MR) 688. The MR 688 defines the mode of operation of the DRAM. The MR 688 may reside in SoC with external DRAM 631 or it may reside within external DRAM 630.

Usually, as of this writing, the MR 688 has a plurality of configurable bits that can be dynamically updated to reflect changing system requirements. They may include, but are not limited to, bits used to adjust the selection of a burst length, burst type, CAS latency, operating mode, delay locked loop (DLL) RESET, write recovery, and power-down mode, as understood by one of ordinary skill in the art. The MR 688 may distribute the PASR requests/commands among the memory ranks that may form each DRAM 631, 630.

Figure 2A:
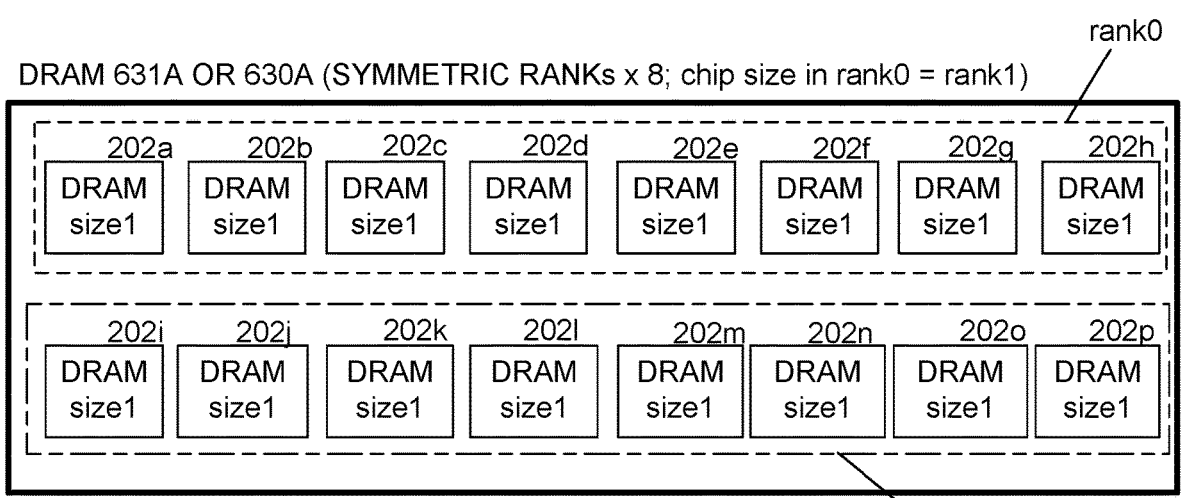
FIG. 2A is a functional block diagram of exemplary symmetrical memory ranks forming DRAM.

Referring now to FIG. 2A, this figure is a functional block diagram of exemplary symmetrical ranks forming DRAM 631A-630A. According to this exemplary embodiment, a first memory rank, rank0, may have eight memory chips 202*a*-202*h*. And each of these chips 202 of the first rank, rank0, may have a first size (i.e. size1).

Similarly, a second memory rank of DRAM 631A-630A, rank1, may also have eight memory chips 202*i*-202*p*. And each of these chips 202 of the second rank, rank1, may have the same first size (i.e. size1) as those chips 202 in the first memory rank, rank0. Because both ranks, rank0 and rank1, have equal sizes, they are referred to in this disclosure as "symmetrical" memory ranks that may form a DRAM 631A and/or 630A.

Exemplary sizes for each memory rank may include, but are not limited to, 256 megabytes (MB), 512 MB, 1 GB, 2 GB, 4 GB, 16 GB, etc. Other sizes greater or less than these are possible for each rank and are included within the scope of this disclosure. Further, while eight (8)-bit wide ranks are illustrated in FIG. 2A, other ranks are possible such as four (4)-bit wide ranks that would include sixteen (16) chips 202 (not illustrated).

Figure 2B:
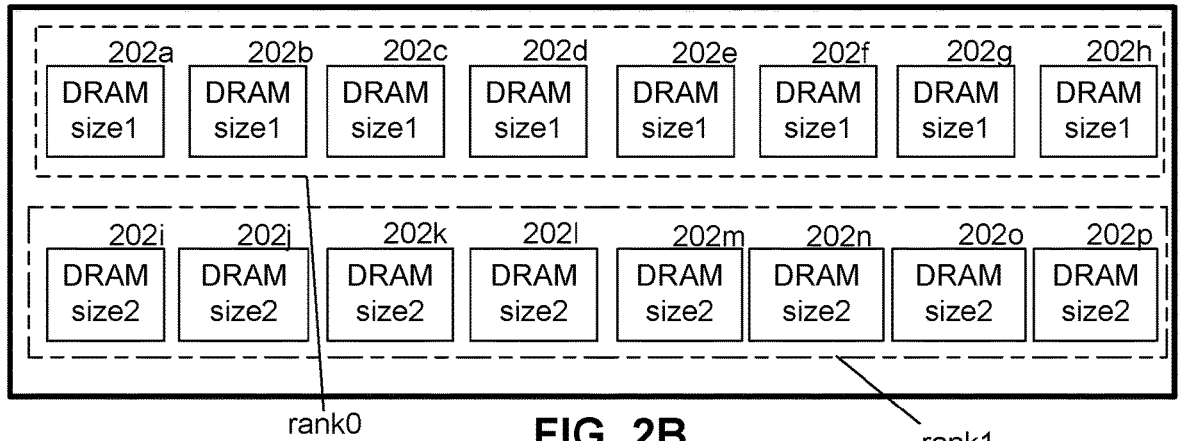
FIG. 2B is a functional block diagram of exemplary asymmetrical memory ranks forming DRAM.

Referring now to FIG. 2B, this figure is a functional block diagram of exemplary asymmetrical ranks forming DRAM 631B and/or 630B. This diagram is similar to FIG. 2A, so only the differences will be described here.

According to this exemplary embodiment of FIG. 2B, each chip 202 of the first rank, rank0, has a first size/capacity of size1. Meanwhile, each chip 202 of the second rank, rank1, has a second size/capacity of size2. This size2 may be greater than size1, or vice-versa. Because each memory rank, rank0 and rank1, has a different size relative to each other, then they are referred to in this disclosure as "asymmetrical" memory ranks that may form DRAM 631B and/or 630B.

Figures 3A, 3B, 3C:
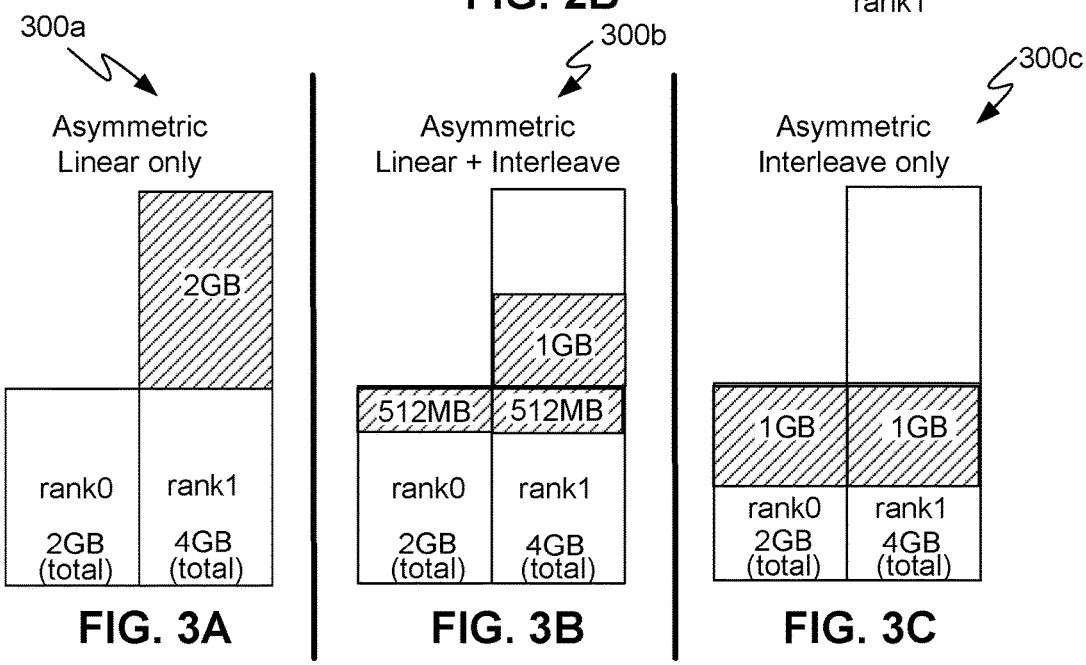
FIG. 3A is a functional block diagram illustrating the completion of a PASR request from the kernel by asymmetric memory ranks in a linear only fashion/manner.
FIG. 3B is a functional block diagram illustrating the completion of a PASR request from the kernel by asymmetric memory ranks in a linear with interleave manner.
FIG. 3C is a functional block diagram illustrating the completion of a PASR request from the kernel by asymmetric memory ranks in an interleave only manner.

Referring now to FIG. 3A, this figure is a functional block diagram 300*a* illustrating the completion of a PASR request from the kernel 603 by asymmetric memory ranks (rank0 & rank1) in a linear only fashion/manner. According to this exemplary embodiment and the ones illustrated in FIGS. 3B-3C, the first memory rank, rank0, may have a size of 2.0 GB. Meanwhile, the second memory rank, rank1, may have a size of 4.0 GB. As noted previously, because the memory ranks have different sizes relative to each other, then they are referred to in this disclosure as "asymmetrical" memory ranks.

According to this exemplary embodiment shown in FIG. 3A, the RPM 601 determined that a 2.0 GB PASR request from the kernel 603 should be completed in a linear fashion/linear manner, which means only one memory rank, the second memory rank (rank1) is used to complete the PASR request.

This means that the shaded region of 2 GB of the second rank (rank1) is refreshed if the PASR request was in connection with a memory allocation request. The RPM 601 chose the linear refresh only of the second rank (rank1) because two conditions were found true by the RPM 601: (1) the start memory address for the PASR request was greater than or equal to two times the minimum of the size of the two memory ranks available; AND (2) the end memory address for the PASR request was also greater than two times the minimum of the size of the two memory ranks available. See decision step 330 of FIG. 3F described in more detail below.

If the PASR request was made by the kernel 603 in connection with a memory de-allocation request (i.e. the release of use of memory, etc.), then the shaded region of 2 GB of the second memory rank (rank1) would NOT be refreshed. According to this exemplary embodiment, the first memory rank (rank0) would not complete any portion of the PASR request.

Referring now to FIG. 3B, this figure is a functional block diagram 300*b* illustrating the completion of a PASR request from the kernel by asymmetric memory ranks (rank0 & rank1) in a linear with interleave manner. This exemplary embodiment is similar to the one illustrated in FIG. 3A, so only the differences will be described here.

According to this exemplary embodiment, the RPM 601 has determined that completion of the PASR request should be completed in both a linear and an interleave fashion. That is, the RPM 601 has determined that a first portion of a 2.0 GB PASR request should be completed by the two memory ranks (first rank0 & second rank1) in an interleave fashion, while a second portion of the 2.0 GB PASR request should be completed by only one of the memory ranks (rank1), the larger of the two memory ranks.

According to this exemplary embodiment, the RPM 601 has 512 MB of the first memory rank, rank0, (i.e. the shaded 512 MB portion) to complete that portion of the 2.0 GB PASR request. The RPM 601 then has 512 MB of the second memory rank (rank1) to complete this second portion (i.e. the second shaded 512 MB portion) of the 2.0 GB request.

And lastly, as shown in FIG. 3B, the RPM 601 has 1.0 GB of the second memory rank (rank1) to complete the third and last portion (i.e. the shaded 1 GB portion) of the 2.0 GB request. It is noted that portions of the PASR request created by the RPM 601 can have different sizing, than those illustrated in FIGS. 3A-3C, and as determined by the RPM 601.

Referring now to FIG. 3C, this figure is a functional block diagram 300*c* illustrating the completion of a PASR request from the kernel by asymmetric memory ranks (rank0 & rank1) in an interleave only manner. This exemplary embodiment is similar to the one illustrated in FIG. 3B, so only the differences will be described here.

In this scenario illustrated in FIG. 3C, the RPM 601 has determined that the most efficient way to complete a PASR request originating from the kernel 603 is to complete the PASR request such it is interleaved and shared equally across the two memory ranks (rank0 and rank1). So the RPM 601 has divided the 2.0 GB PASR request from the kernel 603 into two equal portions of 1.0 GB that are evenly distributed across the two memory ranks (rank0 and rank1). In this way, both ranks (rank0 and rank1) complete the same amount of the PASR request.

Figure 3D:
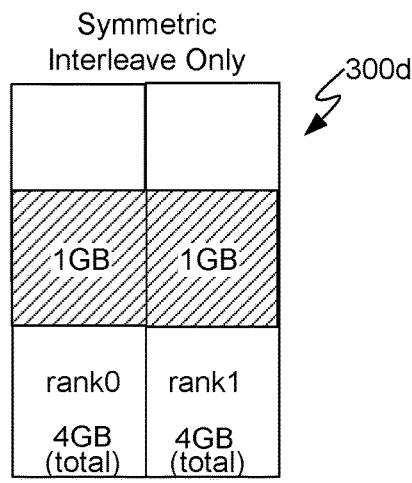
FIG. 3D is a functional block diagram illustrating the completion of a PASR request from the kernel by symmetric memory ranks in an interleave only manner.

Referring now to FIG. 3D, this figure is a functional block diagram 300e illustrating the completion of a PASR request from the kernel by symmetric memory ranks (rank0 & rank1) in an interleave only manner. Unlike FIGS. 3A-3C, the memory ranks (rank0 & rank1) have the same amount of memory—i.e. they are the same size. According to this exemplary embodiment, the size for each rank is 4.0 GB. Sizes larger or smaller for the memory ranks (rank0 & rank1) are possible and are included within the scope of this disclosure as understood by one of ordinary skill in the art.

When the two or more memory ranks (here, rank0 and rank1 shown in FIG. 3D) are of equal size, then the RPM 601 determines that the most efficient way to complete any PASR request from the kernel 603 is to complete it in an interleave only manner that is shared equally across the multiple memory ranks. So for this 2.0 GB PASR request example, the RPM 601 would break the request into two equal portions, here 1.0 GB each, and perform each 1.0 GB PASR request in each memory rank of the two memory ranks.

Figure 3E:
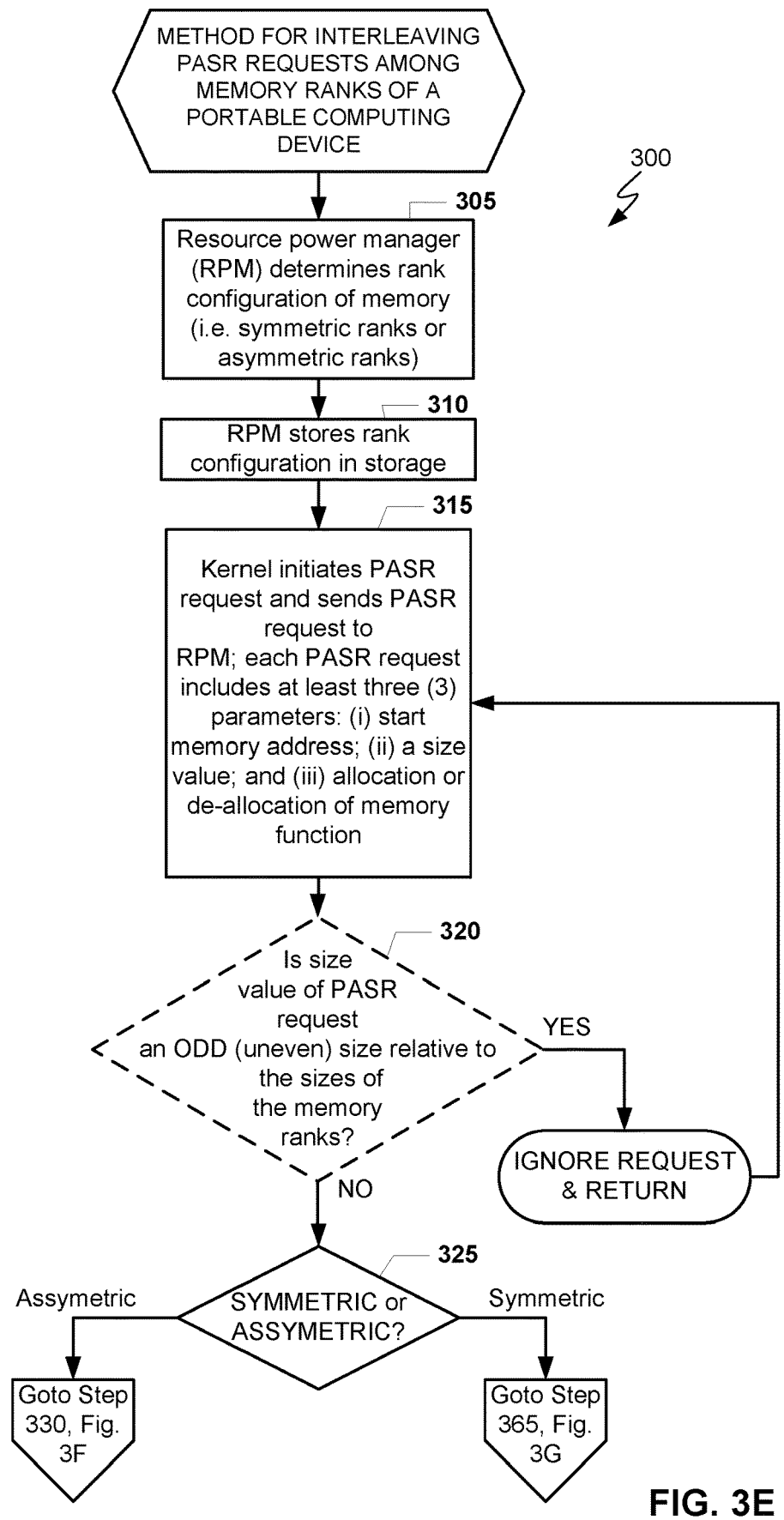
FIG. 3E is a logical flowchart illustrating a method for interleaving Partial Array Self-Refresh (PASR) requests among memory ranks of a portable computing device (PCD)
Figure 6:
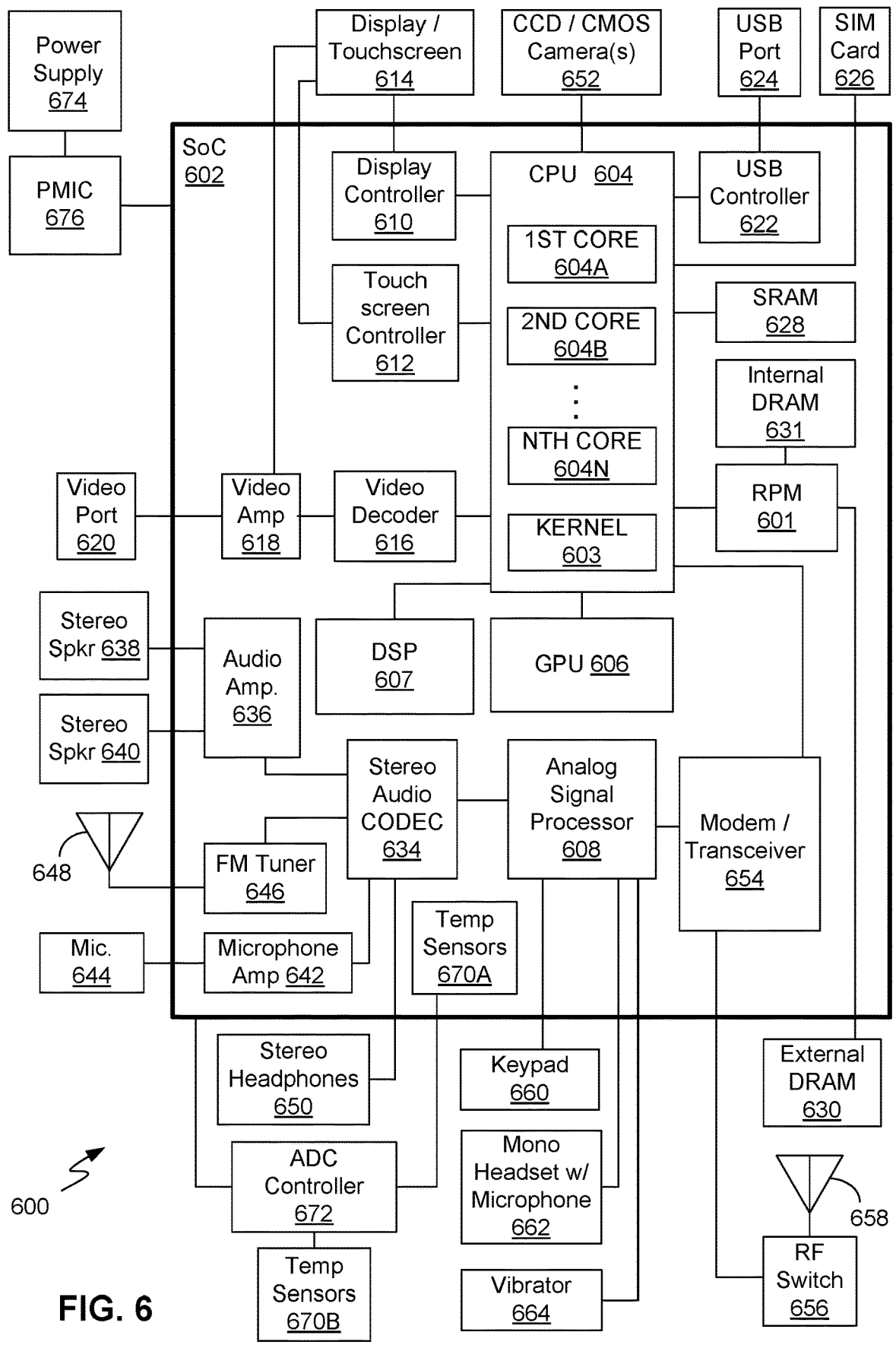
FIG. 6 is a block diagram of a portable computing device, in accordance with exemplary embodiments.

Referring now to FIG. 3E, this figure is a logical flowchart illustrating a method 300 for interleaving Partial Array Self-Refresh (PASR) requests among memory ranks of a portable computing device (PCD) 600 (See FIG. 6). Step 305 is the first step of the method 300.

In step 305, the resource power manager (RPM) 601 (see FIG. 1) determines the rank configuration for a memory 631, 630 of a portable computing device 600. Specifically, the RPM 601 determines if the memory 631, 630 of a PCD 600, which comprises DRAM, has either a symmetric configuration or an asymmetric configuration.

As described above, a symmetric configuration is present when the memory ranks of DRAM 631, 630 are of equal size. Meanwhile, an asymmetric configuration is present when the memory ranks of DRAM 631, 630 are of an unequal size.

Next, in step 310, the RPM 601 stores the rank configuration in storage or memory. This rank configuration may be accessed later by the RPM 601 when the RPM 601 receives a Partial Array Self-Refresh (PASR) request for refreshing DRAM 631, 630.

In step 315, the kernel 603 executed by a CPU 604 may initiate a PASR request and transmit that request to the RPM 601. Each PASR request usually will have at least three (3) parameters: (i) a start memory address for the request; (ii) a size value which is how much memory should be refreshed; and (iii) a data element indicating whether the request is part of a memory allocation or a memory de-allocation function.

When the PASR request is part of a memory allocation request (i.e. reserving memory that is going to be used as directed by the kernel 603), then the memory address range that forms part of the request indicates that these addresses in DRAM will be refreshed. Meanwhile, when the PASR request is part of a memory de-allocation request (i.e. letting go of memory that is NOT going to be used as directed by the kernel 603), then the memory address range that forms part of the request indicates that these addresses in DRAM will NOT be refreshed, while other addresses outside of the range may be refreshed.

Next in optional decision step 320, the RPM 601 may determine if the size value of the PASR request is an odd size relative to the sizes of the memory ranks present in DRAM 631, 630. That is, in this optional decision step 320 highlighted with dashed lines, the RPM 601 may determine if the size value of the PASR request does not squarely or evenly match the size of the memory ranks which form DRAM 631, 630.

DRAM usually has a minimum segment size that can be put in PASR and that segment size that can be put in PASR depends on the density and size of the memory rank. So if the PASR request is such that the memory address range in both the ranks does not fit into the multiples of the minimum segment size of rank, then such a request will usually be discarded by the RPM 601.

For example if a first memory rank (rank0) has a size of 2 GB and a second memory rank (rank1) has a size of 4 GB, then this means that the minimum segment size of the second memory rank (rank0) has a size of 0.5 GB because each memory rank in the second memory rank has eight (8) segments (i.e. 4 GB total size+8=0.5 GB or 512 MB), according to this exemplary embodiment. However, as noted previously, other sizes and combinations, as well as the number of memory ranks and/or segments may be adjusted without departing from the scope of this disclosure.

Suppose there is a PASR request of 5.25 GB size issued from the kernel 603 starting from a memory address of zero (0). In this case, the rank1 size that needs to be kept in PASR would be 3.25, which is not an integer multiple of the minimum segment size of rank1 which is 0.5 GB. So this request will usually be ignored by the RPM 601.

So if the inquiry to optional decision step 320 is positive, meaning that the PASR request is "odd"/"uneven" relative to the sizes of the memory ranks (i.e. the minimum segment size for each rank) forming DRAM 631, 630, then the "Yes" branch may be followed where method 300 may just ignore this request and then return to step 315 where the RPM 601 waits for a PASR request from the kernel 603. Decision step 320 is designated as optional because, in some exemplary embodiments, the RPM 601 or the kernel 603 (or both) can be programmed/instructed to only issue PASR requests of "even" sizes which evenly fit within the sizes of the multiple memory ranks forming DRAM 631, 630. In such instances, optional step 320 may be removed/eliminated.

If the inquiry to decision step 320 is negative, meaning that the size value for the PASR request will fit evenly within the multiple memory ranks of DRAM 631, 630, then the "No" branch is followed to decision step 325.

In decision step 325, the RPM 601 determines if the memory ranks have a symmetric configuration or an asymmetric configuration. This configuration status was determined in prior step 305. So if the DRAM 631, 630 has an asymmetric ("uneven") configuration, then the "asymmetric" branch is followed to Step 330 of FIG. 3F. And if the DRAM 631, 630 has a symmetric ("even" or "balanced") configuration, then the "symmetric" branch is followed to Step 365 of FIG. 3G.

Figure 3F:
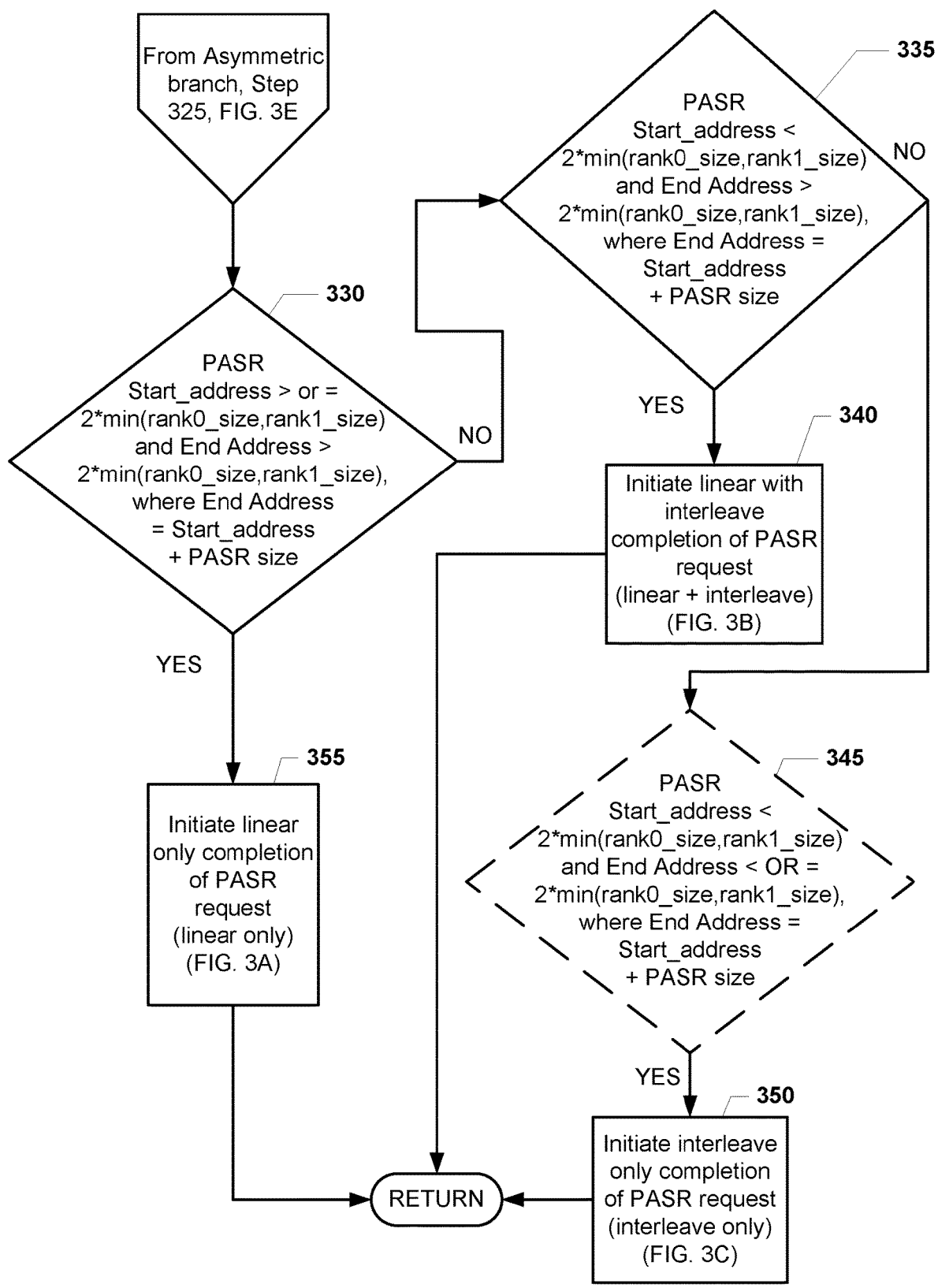
FIG. 3F is a continuation of the flowchart of FIG. 3E and it illustrates the completion of a PASR request by an asymmetric memory rank configuration for DRAM.

Referring now to FIG. 3F, this figure is a continuation flowchart of FIG. 3E and starts at decision step 330 which is a result of the "asymmetric" configuration determination made by RPM 601 in decision step 325 described above in connection with FIG. 3E. In this decision step 330, the RPM 101 determines if the start memory address from the PASR request originating from the kernel 603, and an end memory address, falls outside of certain thresholds as will be explained below.

The logic for decision Step 330 is as follows:
Is PASR Start_address> or =2*min(rank0_size, rank1_size)
and the End Address>2*min(rank0_size, rank1_size)
where the End Address=Start_address+PASR size.

The value min(rank0_size, rank1_size) is the minimum size between two memory ranks (rank0, rank1—See FIGS. 3A-3C) of an asymmetrical, two memory rank module. So this value min(rank0_size, rank1_size) for the 2 GB and 4 GB examples of FIGS. 3A-3C, would be the value of 2 GB, which is the smaller of the two memory ranks.

So let's take a specific example: suppose a kernel 603 issues a PASR request having a start memory address of 5 GB and a size value of 1 GB. And suppose we have the asymmetrical memory configuration illustrated in FIGS. 3A-3C, where rank0=2 GB, and rank1=4 GB.

The start memory address=5 GB. The End Address=5 GB (start address)+size (1 GB)=6 GB. So the start memory address is 5 GB is >2*min(rank0_size, rank1_size)=4 GB min. And the end address 6 GB is >4 GB min. This example corresponds with row 405 of Table 400 in FIG. 4 described below. These values satisfy the conditions decision step 330 in the affirmative, so the "Yes" branch is followed to step 355 in which the RPM 601 initiates a linear only (see FIG. 3A) completion of the PASR request that originated from the kernel 603.

The substeps completed within step 355 for a linear completion of a PASR request are as follows: the RPM 601 determines the start memory address of the PASR request for the memory rank completing the PASR request. Usually, it is the larger memory rank of the two memory ranks which will complete the PASR request for a linear only completion of the PASR request. The logic for this linear only completion is as follows:

PASR start memory address for the single rank handling the PASR request:
If (rank0_size<rank1_size)
Then:

PASR_start_address_rank1=PASR Request start address−rank0_size

Size of PASR for rank1=request_size.
If the memory rank0 is the smaller rank of the two ranks, then it does not handle any portion of the PASR request.
Else (rank0_size>rank1_size)
Then:

PASR_start_address_rank0=PASR Request start address−rank1_size

Size of PASR for rank0=request_size.
No PASR on Rank1

So taking the FIG. 3A example and row 405 of the table 400 of FIG. 4, rank1 is the larger of the two memory ranks and it will complete the entire PASR request which has a start memory address of 5 GB and a PASR size of 1 GB. The start memory address for the rank1 which will complete the request will be determined by the RPM 601. The start memory address in this example will be 5B−(minus) 2 GB (size of rank0)=3 GB start memory address in rank1. The rank1 memory rank will complete the entire 1 GB sized PASR request. See row 405 of table 400 of FIG. 400.

Referring back to decision step 330 of FIG. 3F, if the inquiry to decision step 330 is negative, meaning that PASR start memory address and End Address are both less than (<)2*min(rank0_size,rank1_size), then the "No" branch is followed to decision step 335. In decision step 335, the RPM 601 determines if the PASR start memory address and the End Address fall between the two thresholds, previously described in decision step 330. The two thresholds described in decision step 330 are very similar to the two thresholds described here for decision step 335, so only the differences will be explained here.

Specifically, the logic for decision step 335 is as follows:
Is PASR Start_address<2*min(rank0_size, rank1_size)
and the End Address>2*min(rank0_size, rank1_size)
where the End Address=Start_address+PASR size.

Notably, in this decision step 335, the PASR Start_address is determined if it is less than (<) 2*min(rank0_size, rank1_size) value. As described above, in decision step 330, the PASR Start_address is determined if it is greater than (>) or equal to (=) the 2*min(rank0_size, rank1_size) value. Meanwhile, the second threshold of decision step 335 is the same as decision step 330: the End Address>2*min(rank0_size, rank1_size).

So let's take a specific example: suppose a kernel 603 issues a PASR request having a start memory address of 3 GB and a size value of 3 GB. And suppose we have the asymmetrical memory configuration illustrated in FIGS. 3A-3C, where rank0=2 GB, and rank1=4 GB.

The start memory address=3 GB. The End Address=3 GB (start address)+size (3 GB)=6 GB. So the start address is 3 GB is <2*min(rank0_size, rank1_size)=4 GB min. And the end address 6 GB is >4 GB min. This example corresponds with row 415 of Table 400 in FIG. 4 described below. These values satisfy the conditions decision step 335 in the affirmative, so the "Yes" branch is followed to step 340 in which the RPM 601 initiates a linear with interleave (see FIG. 3B) completion of the PASR request that originated from the kernel 603.

The substeps completed within step 340 for a linear with interleave completion of a PASR request are as follows: the RPM 601 determines the start address for the PASR request in each memory rank and then it determines how much each memory rank will complete of the PASR request because each rank will handle a different sized portion of the PASR request. The logic for this linear with interleave completion of the PASR request in step 340 is as follows:

PASR start address for each rank:
[PASR_start_address_rank0=PASR_start_address_rank1]
=PASR Request Start address/2.

In other words, the start address for the PASR request in each memory rank will be one-half of the initial start address in the PASR request originating from the kernel 603. Next, the RPM 601 then calculates the size of the PASR request for each memory rank:

Sizes of PASRs for each rank:
If (rank0_size<rank1_size)
Then:

rank0_PASR_size=rank0_size−PASR_start_address_rank0 rank1_PASR_size=request_size−rank0_pasr_size

-----------------------------------------
- - - -

Else (rank0_size>rank1_size):
Then:

rank1_pasr_size=rank1_size−Pasr_start_address_rank1 rank0_pasr_size=request_size−rank1_pasr_size

So taking the FIG. 3B example and row 415 of the table 400 of FIG. 4, rank0 is less than rank1 with respect to size. As noted above the PASR request from the kernel had a start address of 3 GB and a size of 3 GB. Therefore, the start address for the PASR request in each rank (rank0 & rank1) would be 3 GB/2=1.5 GB start address for each rank. The rank0_pasr_size=rank0_size (2 GB)−PASR_start_address_rank0 [1.5]=0.5 GB will be the PASR size for rank0 (see row 415, column 8 of Table 400 in FIG. 4). Meanwhile, the rank1_pasr_size for rank1=request size (3 GB)−rank1_pasr_size (0.5 GB)=2.5 GB (see row 415, column 9 of Table 400 in FIG. 4).

Thus, the FIG. 3B example which shows an "Asymmetric Linear+Interleave" type of memory refresh is more efficient compared to the prior art because the memory refresh occurs within all memory ranks and in a parallel yet balanced manner. Meanwhile, as noted previously, memory refreshes in the prior art would occur separately in each rank and in a sequential manner (not in parallel—i.e. rank0 refreshes first, and then rank1 refreshes second).

Referring back to decision step 335 of FIG. 3F, if the inquiry to decision step 335 is negative, meaning that PASR start address is less than PASR request start address from the kernel 603 less than (<) 2*min(rank0_size, rank1_size) value BUT the end address IS ALSO less than (<) 2*min (rank0_size, rank1_size), the "NO" branch is followed to optional decision step 345. Decision step 345 is designated as optional because the "negative" output from decision step 335 means that such output will always satisfy decision step 345 as will be shown below.

In decision step 345, the RPM 601 determines if the both the PASR start address and End Address are less than the two thresholds described previously. The two thresholds described in decision step 335 are very similar to the two thresholds described here for decision step 345, so only the differences will be explained here.

Specifically, the logic for decision step 345 is as follows:
Is PASR Start_address<2*min(rank0_size, rank1_size) and the End Address< or =2*min(rank0_size, rank1_size)
where the End Address=Start_address+PASR size.

Meanwhile, in decision step 330, as described above, the RPM 601 was checking to determine if the PASR Start_address and the End Address were both greater than the two thresholds listed above.

So let's take a specific example to satisfy decision step 345: suppose a kernel 603 issues a PASR request having a start address of 2 GB and a size value of 2 GB. And suppose we have the asymmetrical memory configuration illustrated in FIGS. 3A-3C, where rank0=2 GB, and rank1=4 GB.

The PASR start address=2 GB is less than (<) 2*min (rank0_size, rank1_size)=4 GB. And the End Address=2 GB+2 GB=4 GB. This End Address of 4 GB is less (<) or (=) to 4 GB [=2*min(rank0_size, rank1_size)]. So the two conditions of decision step 345 are satisfied, and the method 300 proceeds to step 350 in which an interleave only completion of the PASR request is completed.

The substeps completed within step 350 for interleave only completion of a PASR request are as follows: the RPM 601 determines the start address for the PASR request in each memory rank and then it determines how much each memory rank will complete of the PASR. The logic for this interleave only completion of the PASR request in step 350 is as follows:
PASR start address for each rank:
[PASR_start_address_rank0=PASR_start address rank1]=PASR Request Start address/2
Sizes of PASRs for each rank:
rank0_pasr_size=rank1_pasr_size=PASR_request_size/2

Basically, in step 350, the RPM divides the PASR start address from the kernel 603 in half and the size of the PASR request in half. Specifically, referring to FIG. 3C and to row 410 of table 400 of FIG. 4, where rank0 has a size of 2 GB and rank1 has a size of 4 GB, and the PASR start address from the kernel 603 is 2 GB and has a size of 2 GB, the rank0 & rank 1 PASR start address=1 GB. Meanwhile, each memory rank (rank0 & rank1) will complete an equal amount of the PASR request−total size divided by 2=2 GB/2=1 GB pasr size for each rank. Thus, the FIG. 3C example which shows an "Asymmetric Interleave" type of memory refresh is more efficient compared to the prior art because the memory refresh occurs within all memory ranks and in a parallel yet balanced manner. Meanwhile, as noted previously, memory refreshes in the prior art would occur separately in each rank and in a sequential manner (not in parallel—i.e. rank0 refreshes first, and then rank1 refreshes second).

Referring back to steps 340, 350, and 355, after these steps are completed by the RPM 601, the method 300 returns back to step 315 of FIG. 3E where the RPM 601 waits for a PASR request from the kernel 603.

Figure 3G:
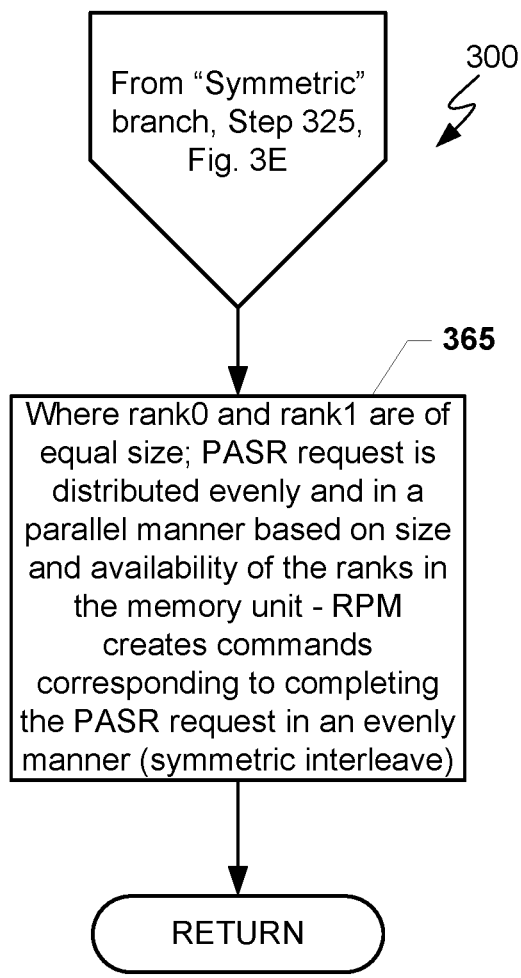
FIG. 3G is a continuation of the flowchart of FIG. 3E and it illustrates the completion of a PASR request by a symmetric memory configuration.

Referring now to FIG. 3G, this figure is a continuation of the flowchart of FIG. 3E and it illustrates the completion of a PASR request by a symmetric memory configuration. Specifically, the flowchart of FIG. 3G corresponds to the "symmetric" branch/output of decision step 325 of FIG. 3E.

In step 365 of FIG. 3G, the PASR request from the kernel 603 is distributed evenly and in a parallel manner based on size and availability of the ranks in the symmetric memory unit (DRAM 631, 630). The RPM 601 creates commands for completing the PASR request in an evenly manner (symmetric interleave). In this step 365, the RPM 601 may divide the start address of the PASR request in one-half and the size of the request in one-half, such that each rank starts its refresh operation at the same start address and completes one-half of the total size value for the PASR request.

Step 365 of FIG. 3G corresponds with FIG. 3D described above. So referring briefly back to FIG. 3D, the PASR request may be completed in a parallel manner. The PASR request may start at the same memory address in each rank (rank0 & rank1). Thus, the FIG. 3D example which shows a "Symmetric Interleave" type of memory refresh is more efficient compared to the prior art because the memory refresh occurs within all memory ranks and in a parallel yet balanced manner. Meanwhile, as noted previously, memory refreshes in the prior art would occur separately in each rank and in a sequential manner (not in parallel—i.e. rank0 refreshes first, and then rank1 refreshes second).

After step 365 is completed, the method 300 may return (re-start) to step 315 where the RPM 601 waits for a PASR request from the kernel 603.

FIG. 4 is a table 400 illustrating the three types of interleave scenarios for an asymmetric DRAM memory configuration that are supported by the exemplary method 300 illustrated in FIGS. 3E-3F. According to this example, the first memory rank (rank0) has a size of 2 GB, while the second memory rank (rank1) has a size of 4 GB. Further each memory rank in this example has eight (8) segments. As noted previously, other sizes and combinations, as well as the number of memory ranks and/or segments may be adjusted without departing from the scope of this disclosure.

The first row 405 illustrates a linear only completion of a PASR request. Row 405 was previously described in connection with step 355 of FIG. 3F described above. The second column of the first row shows that the PASR request has a PASR start address of 5 GB and while the third column shows a PASR size of 1 GB.

The fourth column, six column and eighth column of the first row 405 shows that the first memory rank (rank0) does not support any completion of the PASR request. Meanwhile, the fifth column of the first row 405 shows that the RPM 601 determined that the start address for the PASR request in the second memory rank (rank1) should be at 3 GB. The size of the PASR request was 1 GB, so 1 GB will be refreshed in rank1 as shown in column 9 (if an allocation PASR request; or NOT refreshed if a deallocation PASR request as noted above), which indicates the PASR size in rank1.

And based on the 3 GB start address for the PASR request and the segment size for rank1 (each segment=512 MB in size), then segments 6, 7 of rank1 will be refreshed in the case of a memory deallocation PASR request. Meanwhile, the other six segments 0-5 in rank1 are not refreshed based on this type of request (deallocation).

As noted above, memory rank segments requested by the kernel 603 will be refreshed or not refreshed based on the type of the PASR request: whether a memory allocation or memory deallocation PASR request. The state of other segments of each memory rank will stay unchanged relative to the PASR request. Memory allocation PASR requests will usually be "ORed" with the current state of the memory rank and will be marked for refresh, while any memory deallocation PASR request will mark the corresponding segments TO NOT BE refreshed. The current state of an eight segment memory rank is usually tracked/maintained with an eight bit variable by the RPM 601.

As an example:
For a memory allocation PASR request:
current state[rank_id]=current_state[rank_id] OR segments request[rank id]
Else
current state=current_state[rank_id] and (Not segment_request[rank_id]))
Under this example, for a memory deallocation PASR request,
if current_state[rank1]=0x0, new current_state[rank1]=0xC0 (6th and 7th bit set). And if a follow-on PASR request is a memory allocation request with the same start address and size, then the new current_state[rank1] will be 0x0, (6th and 7th bit will be reset), while other bits remain unchanged.

The second row 410 of table 400 illustrates an interleave only completion of a PASR request. This row 410 was described above in connection with step 350 of FIG. 3F.

The second column of the second row 410 shows that the PASR request has a PASR start address of 2 GB and while the third column shows a PASR size of 2 GB. Based on the 2 GB PASR size in the third column of row 410 and the size of rank0, the RPM 601 determines that the interleave only condition of decision step 345 is satisfied in the affirmative. The RPM 601 determines in step 350 that the start address for the PASR request should be at 1 GB for each memory rank (rank0 & rank1) as shown in the fourth and fifth columns of the second row 405. Also in step 350, the RPM 101 will also designate each memory rank to support one-half of the PASR request. Since the PASR request size was 2 GB as shown in the third column, then the RPM 101 will have each memory rank complete one-half of the PASR request (=1 GB) as shown in the eight and ninth columns of the second row 410.

Based on the start address of 1 GB shown in the fourth and fifth columns of row 410, and based upon the size of the PASR request being completed by each memory rank (=1 GB for this example), and based on the segment sizes of each memory rank, the RPM 601 determines segments 4, 5, 6, 7 of rank0 (column 6) and segments 2, 3 of rank 1 (column 7) will be refreshed (or not refreshed based on the type of the PASR request—whether a memory allocation or deallocation request, as explained above).

The third row 415 of table 400 illustrates an interleave with linear completion of a PASR request. This row 410 was previously described in connection with step 340 of FIG. 3F.

The second column of the third row 415 shows that the PASR request has a PASR start address of 3 GB and while the third column shows a PASR size of 3 GB. The RPM 601 determines in step 340 that the start address for the PASR request should be at 1.5 GB for each memory rank (rank0 & rank1) as shown in the fourth and fifth columns of the second row 405. Also in step 350, the RPM 101 will also break the PASR request into two unequal portions. Based on this start address in the first memory rank (rank0), this will determine how large the portion of the PASR request will be completed by the first memory rank (rank0). Since rank0 only has 2 GB and the start address is at 1.5B, then only 12 of 1 GB (512 MB) will be refreshed by rank0 as shown in the eighth column of the third row 415. This means only two segments 6, 7 of rank0 will be refreshed as shown in in the sixth column (or not refreshed based on the type of the PASR request—whether a memory allocation or deallocation request, as explained above). Meanwhile, segments 0-5 of the first memory rank (rank0) are not refreshed for this request (or they are refreshed based on the type of the PASR request—whether a memory allocation or deallocation request, as explained above).

Meanwhile, the remaining portion of the PASR request in row 415 of table 400, which is 2.5 GB in size, will be completed by the second memory rank (rank1) (as shown in the ninth column). Based on the start address of 1.5 GB and the second memory rank's segment size of 512 MB per segment, the RPM 601 calculates in step 340 that segments 3, 4, 5, 6, 7 will complete the 1.5 GB for the PASR request as shown in the seventh column of row 415. This means that segments 0-2 of the second memory rank (rank1) are not refreshed for this request (or they could be refreshed in another instance based on the type of the PASR request—whether a memory allocation or deallocation request, as explained above).

FIG. 5A is a table 500 illustrating a PASR request handled by a symmetric DRAM memory configuration. This table 500 corresponds with step 365 of FIG. 3G. According to this exemplary embodiment, the symmetric DRAM memory configuration comprises two memory ranks (rank0 & rank1), where each rank has a total size of 4 GB and each rank has eight segments. Thus, each segment for each rank has a size of 512 MB.

In the example shown in table 500, the PASR request has start address of 6 GB and a PASR size of 2 GB. The resource power manger 601 in step 365 will split the start address of 6 GB in half such that the PASR rank0 and PASR rank1 address will be at 3 GB as shown in the fourth and fifth columns. Since each rank segment is 512 MB and the start address is 3 GB, this means the PASR request will start in the segment 6 of each memory rank, given the segments of each memory rank are numbered 0-7. And since each memory rank will support a 1 GB refresh as shown in the eighth and ninth columns of table 500, then this also means that segment 7 of each memory rank will also support the refresh as shown by the seventh and eighth columns of table 500, which list segments 6,7 of each rank completing the PASR memory refresh request.

As illustrated in FIG. 6, exemplary embodiments of systems and methods for interleaving PASR requests among memory ranks may be provided in a portable computing device ("PCD") 600. The PCD 600 may be an example of the computing device 100 described above in connection with FIG. 1.

The PCD 600 may include an SoC 602. The SoC 602 may include a CPU 604, a GPU 606, a DSP 607, an analog signal processor 608, and/or other processors. The CPU 604 may include multiple cores, such as a first core 604A, a second core 604B, etc., through an Nth core 604N. In some examples of the SoC 602, the CPU 604 may be referred to as an application processor.

A display controller 610 and a touch-screen controller 612 may be coupled to the CPU 604. A touchscreen display 614 external to the SoC 602 may be coupled to the display controller 610 and the touch-screen controller 612.

The PCD 600 may further include a video decoder 616 coupled to the CPU 604. A video amplifier 618 may be coupled to the video decoder 616 and the touchscreen display 614. A video port 620 may be coupled to the video amplifier 618. A universal serial bus ("USB") controller 622 may also be coupled to CPU 604, and a USB port 624 may be coupled to the USB controller 622. A subscriber identity module ("SIM") card 626 may also be coupled to the CPU 604.

One or more memories may be coupled to the CPU 604. The one or more memories may include both volatile and non-volatile memories. Examples of volatile memories include static random access memory ("SRAM") 628 and dynamic RAMs ("DRAM"'s) 630 and 631, also described above. Such memories may be external to the SoC 602, such as the DRAM 630, or internal to the SoC 602, such as the DRAM 631. The resource power manager (RPM) 601 described above may be coupled to the CPU 604 and to the internal DRAM 631 and to the external DRAM 630. The RPM 601 may execute and/or contain the logic described above in connection with the flowcharts illustrated in FIGS. 3E-3H. The RPM 601 may be hardware or software or both.

Meanwhile, a stereo audio CODEC 634 may be coupled to the analog signal processor 608. Further, an audio amplifier 636 may be coupled to the stereo audio CODEC 634. First and second stereo speakers 638 and 640, respectively, may be coupled to the audio amplifier 636. In addition, a microphone amplifier 642 may be coupled to the stereo audio CODEC 634, and a microphone 644 may be coupled to the microphone amplifier 642.

A frequency modulation ("FM") radio tuner 646 may be coupled to the stereo audio CODEC 634. An FM antenna 648 may be coupled to the FM radio tuner 646. Further, stereo headphones 650 may be coupled to the stereo audio CODEC 634. Other devices that may be coupled to the CPU 604 include one or more digital (e.g., CCD or CMOS) cameras 652. In addition, a keypad 660, a mono headset with a microphone 662, and a vibrator device 664 may be coupled to the analog signal processor 608.

A radio frequency (RF) transceiver or modem 654 may be coupled to the analog signal processor 608 and CPU 604. An RF switch 656 may be coupled to the modem 654 and an RF antenna 658. Although in the illustrated embodiment the modem 654 is included within the same SoC 602 having the CPU 604 and various other processors, in other embodiments such a modem may be external to such an SoC, e.g., a separate chip, and may itself be referred to as a type of SoC.

The SoC 602 may have one or more internal or on-chip thermal sensors 670A and may be coupled to one or more external or off-chip thermal sensors 670B. An analog-to-digital converter ("ADC") controller 672 may convert voltage drops produced by the thermal sensors 670A and 670B to digital signals. A power supply 674 and a power management integrated circuit (PMIC) 676 may supply power to the SoC 602.

Firmware or software may be stored in any of the above-described memories, such as DRAM 630 or 631, SRAM 628, etc., or may be stored in a local memory directly accessible by the processor hardware on which the software or firmware executes. Execution of such firmware or software may control aspects of any of the above-described methods or configure aspects any of the above-described systems. Any such memory or other non-transitory storage medium having firmware or software stored therein in computer-readable form for execution by processor hardware may be an example of a "computer-readable medium," as the term is understood in the patent lexicon.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Although in an exemplary embodiment the computing device may be the above-described PCD 600, in other embodiments the computing device may be of any type. Alternative embodiments will become apparent to one of ordinary skill in the art to which the invention pertains. For example, DRAM 630 and/or 631 may comprise more than two memory ranks, such as three memory ranks, or four memory ranks, or N memory ranks, where N is an integer.

Thus, the inventive method and system may be extended to DRAM having N memory ranks, where the thresholds of decision steps 330, 335, and 345 of FIG. 3F may be adjusted as follows: N*min(rank0_size, rank1_size, rank2_size.. rankN−1_size), where N is the number of memory ranks. The memory ranks may have equal sizes or unequal/unbalanced/asymmetrical sizes. Using this adjustment to the threshold, the start memory address and end memory address may be determined by the RPM 601 for DRAM having N memory ranks.

Implementation examples are described in the following numbered clauses:

1. A method for refreshing memory in a computing device having asymmetrical memory ranks of different sizes, comprising:
receiving a memory refresh request;
initiating a linear only refresh of one memory rank based on the memory refresh request if a start memory address and an end memory address exceed a threshold;
initiating a linear with interleave memory refresh of the asymmetrical memory ranks if the start memory address is less than the threshold and if the end memory address is greater than the threshold; and
initiating an interleave only memory refresh of the asymmetrical memory ranks if the start memory address and end memory address are both less than the threshold.
2. The method of clause 1, further comprising calculating the end memory address based on a size value that is part of the memory refresh request.
3. The method of clauses 1-2, further comprising determining whether the start memory address value and end memory address value of the refresh request exceed a threshold.
4. The method of clauses 1-3, further comprising determining if the start memory address is less than the threshold and if the end memory address is greater than the threshold.
5. The method of clauses 1-4, wherein initiating the linear only refresh of one memory rank further comprises identifying which segments of the one memory rank will be refreshed.
6. The method of clauses 1-5, wherein initiating a linear with interleave refresh of the asymmetrical memory ranks further comprises determining a start memory address for a memory refresh for each memory rank of the asymmetrical memory ranks.
7. The method of clauses 1-6, further comprising determining a size of a memory refresh for a small memory rank and a size of a memory refresh of a larger memory rank based on the start memory address.
8. The method of clause 7, wherein the size of the memory refresh for the small memory rank is smaller than the size of the memory refresh of the larger memory rank.
9. The method of clauses 1-8, wherein initiating an interleave only memory refresh of the asymmetrical memory ranks further comprises determining a start memory address for a memory refresh for each memory rank of the asymmetrical memory ranks.
10. A system for refreshing memory in a computing device, comprising:
an operating system originating memory refresh requests; and
a resource power manager coupled to the operating system and coupled to memory, the memory having a plurality of memory ranks; the resource power manger receiving a memory refresh request from the operating system; the resource power manager determining if the plurality of memory ranks are either symmetrical or asymmetrical; if the memory ranks are symmetrical, then the resource power manager distributes the memory refresh request evenly and in a parallel manner across the symmetrical memory ranks; if the memory ranks are asymmetrical, then the resource power manager determines an end memory address based upon a start memory address and then the resource power manager determines whether the start memory address and end memory address both exceed a threshold.
11. The system of clause 10, wherein if the resource power manger determines that the start memory address and end memory address both exceed the threshold, then the resource power manager initiates a linear only refresh of one memory rank based on the memory refresh request.
12. The system of clauses 10-11, wherein the resource power manager determines if the start memory address is less than the threshold and if the end memory address is greater than the threshold.
13. The system of clauses 10-12, wherein if the resource power manger determines if the start memory address is less than the threshold and if the end memory address is greater than the threshold, then the resource manager initiates a linear with interleave memory refresh of the asymmetrical memory ranks.
14. The system of clauses 10-13, wherein if the resource power manger determines that the start memory address and end memory address are less than the threshold, then the resource power manager initiates an interleave only memory refresh of the asymmetrical memory ranks.
15. The system of clauses 10-14, wherein the resource power manager initiating the linear only refresh of one memory rank further comprises the resource power manager identifying which segments of the one memory rank will be refreshed.
16. The system of clauses 10-15, wherein the resource power manager initiating a linear with interleave refresh of the asymmetrical memory ranks further comprises the resource power manger determining a start memory address for a memory refresh for each memory rank of the asymmetrical memory ranks.
17. The system of clauses 10-16, further comprising the resource power manager determining a size of a memory refresh for a small memory rank and a size of a memory refresh of a larger memory rank based on the start memory address.
18. The system of clauses 10-17, wherein the size of the memory refresh for the small memory rank is smaller than the size of the memory refresh of the larger memory rank.
19. The system of claims 10-14, wherein the resource power manager initiating an interleave only memory refresh of the asymmetrical memory ranks further comprises the resource power manger determining a start memory address for a memory refresh for each memory rank of the asymmetrical memory ranks.
20. A system for refreshing memory in a computing device having asymmetrical memory ranks of different sizes, comprising:
means for generating a memory refresh request;
means for initiating a linear only refresh of one memory rank based on the memory refresh request if a start memory address and an end memory address exceed the threshold;
means for initiating a linear with interleave memory refresh of the asymmetrical memory ranks if the start memory address is less than or equal to the threshold and if the end memory address is greater than the threshold; and
means for initiating an interleave only memory refresh of the asymmetrical memory ranks if the start memory address and the end memory address are both less than the threshold.

21. The system of clause 20, further comprising means for calculating an end memory address based on a size value that is part of the memory refresh request.
22. The system of clauses 20-21, wherein the means for initiating the linear only refresh of one memory rank further comprises means for identifying which segments of the one memory rank will be refreshed.
23. The system of clauses 20-22, wherein the means for initiating a linear with interleave refresh of the asymmetrical memory ranks further comprises means for determining a start memory address for a memory refresh for each memory rank of the asymmetrical memory ranks.
24. The system of clauses 20-23, further comprising means for determining a size of a memory refresh for a small memory rank and a size of a memory refresh of a larger memory rank based on the start memory address.
25. The system of clauses 20-24, wherein the size of the memory refresh for the small memory rank is smaller than the size of the memory refresh of the larger memory rank.
26. A computer-readable medium for refreshing memory in a computing device having asymmetrical memory ranks of different sizes, the computer-readable medium comprising a non-transitory computer-readable medium having stored thereon in computer-executable form instructions that when executed by a processing system of the computing device configure the processing system to:

receive a memory refresh request from an operating system;
initiate a linear only refresh of one memory rank based on the memory refresh request if a start memory address and an end memory address exceed the threshold;
initiate a linear with interleave memory refresh of the asymmetrical memory ranks if the start memory address is less than or equal to the threshold and if the end memory address is greater than the threshold; and
initiate an interleave only memory refresh of the asymmetrical memory ranks if the start memory address and the end memory address are both less than the threshold.

27. The computer-readable medium of clause 25, wherein the end memory address is calculated based on a size value that is part of the memory refresh request.
28. The computer-readable medium of clauses 25-27, wherein the instructions further configure the processing system to determine whether the start memory address value and end memory address value of the refresh request exceed a threshold;
29. The computer-readable medium of clauses 25-28, wherein the instructions further configure the processing system to determine if the start memory address is less than the threshold and if the end memory address is greater than the threshold;
30. The computer-readable medium of clauses 25-29, wherein initiating the linear only refresh of one memory rank further comprises identifying which segments of the one memory rank will be refreshed.

Therefore, although selected aspects have been illustrated and described in detail, it will be understood that various substitutions and alterations may be made therein without departing from the spirit and scope of the present invention, as defined by the following claims.

What is claimed is:

1. A method for refreshing memory in a computing device having asymmetrical memory ranks of different sizes, comprising:
   receiving a memory refresh request;
   initiating a linear only refresh of one memory rank based on the memory refresh request if a start memory address and an end memory address exceed a threshold;
   initiating a linear with interleave memory refresh of the asymmetrical memory ranks if the start memory address is less than the threshold and if the end memory address is greater than the threshold; and
   initiating an interleave only memory refresh of the asymmetrical memory ranks if the start memory address and end memory address are both less than the threshold.
2. The method of claim 1, further comprising calculating the end memory address based on a size value that is part of the memory refresh request.
3. The method of claim 1, further comprising determining whether the start memory address value and end memory address value of the refresh request exceed a threshold.
4. The method of claim 1, further comprising determining if the start memory address is less than the threshold and if the end memory address is greater than the threshold.
5. The method of claim 1, wherein initiating the linear only refresh of one memory rank further comprises identifying which segments of the one memory rank will be refreshed.
6. The method of claim 1, wherein initiating a linear with interleave refresh of the asymmetrical memory ranks further comprises determining a start memory address for a memory refresh for each memory rank of the asymmetrical memory ranks.
7. The method of claim 1, further comprising determining a size of a memory refresh for a small memory rank and a size of a memory refresh of a larger memory rank based on the start memory address.
8. The method of claim 7, wherein the size of the memory refresh for the small memory rank is smaller than the size of the memory refresh of the larger memory rank.
9. The method of claim 1, wherein initiating an interleave only memory refresh of the asymmetrical memory ranks further comprises determining a start memory address for a memory refresh for each memory rank of the asymmetrical memory ranks.
10. A system for refreshing memory in a computing device, comprising:
    an operating system originating memory refresh requests; and
    a resource power manager coupled to the operating system and coupled to memory, the memory having a plurality of memory ranks; the resource power manger receiving a memory refresh request from the operating system; the resource power manager determining if the plurality of memory ranks are either symmetrical or asymmetrical; if the memory ranks are symmetrical, then the resource power manager distributes the memory refresh request evenly and in a parallel manner across the symmetrical memory ranks; if the memory ranks are asymmetrical, then the resource power manager determines an end memory address based upon a start memory address and then the resource power manager determines whether the start memory address and end memory address both exceed a threshold.
11. The system of claim 10, wherein if the resource power manger determines that the start memory address and end memory address both exceed the threshold, then the resource power manager initiates a linear only refresh of one memory rank based on the memory refresh request.

12. The system of claim 10, wherein the resource power manager determines if the start memory address is less than the threshold and if the end memory address is greater than the threshold.

13. The system of claim 12, wherein if the resource power manger determines if the start memory address is less than the threshold and if the end memory address is greater than the threshold, then the resource manager initiates a linear with interleave memory refresh of the asymmetrical memory ranks.

14. The system of claim 10, wherein if the resource power manger determines that the start memory address and end memory address are less than the threshold, then the resource power manager initiates an interleave only memory refresh of the asymmetrical memory ranks.

15. The system of claim 14, wherein the resource power manager initiating the linear only refresh of one memory rank further comprises the resource power manager identifying which segments of the one memory rank will be refreshed.

16. The system of claim 13, wherein the resource power manager initiating a linear with interleave refresh of the asymmetrical memory ranks further comprises the resource power manger determining a start memory address for a memory refresh for each memory rank of the asymmetrical memory ranks.

17. The system of claim 16, further comprising the resource power manager determining a size of a memory refresh for a small memory rank and a size of a memory refresh of a larger memory rank based on the start memory address.

18. The system of claim 17, wherein the size of the memory refresh for the small memory rank is smaller than the size of the memory refresh of the larger memory rank.

19. The system of claim 14, wherein the resource power manager initiating an interleave only memory refresh of the asymmetrical memory ranks further comprises the resource power manger determining a start memory address for a memory refresh for each memory rank of the asymmetrical memory ranks.

20. A system for refreshing memory in a computing device having asymmetrical memory ranks of different sizes, comprising:
 means for generating a memory refresh request;
 means for initiating a linear only refresh of one memory rank based on the memory refresh request if a start memory address and end memory address exceed the threshold;
 means for initiating a linear with interleave memory refresh of the asymmetrical memory ranks if the start memory address is less than or equal to the threshold and if the end memory address is greater than the threshold; and
 means for initiating an interleave only memory refresh of the asymmetrical memory ranks if the start memory address and end memory address are both less than the threshold.

21. The system of claim 20, further comprising means for calculating the end memory address based on a size value that is part of the memory refresh request.

22. The system of claim 20, wherein the means for initiating the linear only refresh of one memory rank further comprises means for identifying which segments of the one memory rank will be refreshed.

23. The system of claim 20, wherein the means for initiating a linear with interleave refresh of the asymmetrical memory ranks further comprises means for determining a start memory address for a memory refresh for each memory rank of the asymmetrical memory ranks.

24. The system of claim 23, further comprising means for determining a size of a memory refresh for a small memory rank and a size of a memory refresh of a larger memory rank based on the start memory address.

25. The system of claim 24, wherein the size of the memory refresh for the small memory rank is smaller than the size of the memory refresh of the larger memory rank.

26. A computer-readable medium for refreshing memory in a computing device having asymmetrical memory ranks of different sizes, the computer-readable medium comprising a non-transitory computer-readable medium having stored thereon in computer-executable form instructions that when executed by a processing system of the computing device configure the processing system to:
 receive a memory refresh request from an operating system;
 initiate a linear only refresh of one memory rank based on the memory refresh request if a start memory address and an end memory address exceed the threshold;
 initiate a linear with interleave memory refresh of the asymmetrical memory ranks if the start memory address is less than or equal to the threshold and if the end memory address is greater than the threshold; and
 initiate an interleave only memory refresh of the asymmetrical memory ranks if the start memory address and end memory address are both less than the threshold.

27. The computer-readable medium of claim 26, wherein the end memory address is calculated based on the size value that is part of the memory refresh request.

28. The computer-readable medium of claim 26, wherein the instructions further configure the processing system to determine whether the start memory address and end memory address of the refresh request exceed a threshold.

29. The computer-readable medium of claim 26, wherein the instructions further configure the processing system to determine if the start memory address is less than the threshold and if the end memory address is greater than the threshold.

30. The computer-readable medium of claim 26, wherein initiating the linear only refresh of one memory rank further comprises identifying which segments of the one memory rank will be refreshed.

\* \* \* \* \*